United States Patent
Okubo et al.

(10) Patent No.: US 6,856,196 B2
(45) Date of Patent: Feb. 15, 2005

(54) DISTORTION COMPENSATOR

(75) Inventors: Yoichi Okubo, Tokyo (JP); Kiyoshi Funada, Tokyo (JP); Yasuo Sera, Tokyo (JP); Masaki Suto, Tokyo (JP); Masato Horaguchi, Tokyo (JP); Kazuyoshi Sato, Tokyo (JP); Toshio Takada, Tokyo (JP); Tetsuhiko Miyatani, Tokyo (JP); Naoki Hongo, Tokyo (JP)

(73) Assignee: Hitachi Kokusai Electric Inc., Tokyo (JP)

( * ) Notice: Subject to any disclaimer, the term of this patent is extended or adjusted under 35 U.S.C. 154(b) by 0 days.

(21) Appl. No.: 10/600,594

(22) Filed: Jun. 23, 2003

(65) Prior Publication Data

US 2004/0041628 A1 Mar. 4, 2004

(30) Foreign Application Priority Data

Jul. 2, 2002 (JP) ........................ 2002-193293

(51) Int. Cl.⁷ .............................. H03G 3/20; H03F 1/26
(52) U.S. Cl. ........................................ 330/136; 330/149
(58) Field of Search ................................ 330/136, 149, 330/107

(56) References Cited

U.S. PATENT DOCUMENTS

| | | | | |
|---|---|---|---|---|
| 3,644,830 A | * | 2/1972 | Ragsdale .................... | 375/270 |
| 3,731,199 A | * | 5/1973 | Tazaki et al. ................ | 375/288 |
| 6,201,841 B1 | * | 3/2001 | Iwamatsu et al. ........... | 375/346 |
| 6,388,518 B1 | * | 5/2002 | Miyatani ..................... | 330/149 |

\* cited by examiner

Primary Examiner—Patricia Nguyen
(74) Attorney, Agent, or Firm—Wenderoth, Lind & Ponack, L.L.P.

(57) ABSTRACT

A distortion compensator that compensates for distortion arising in a main amplifier 10 that amplifies a signal effectively compensates for third order distortion which is unbalanced between the higher frequency band and lower frequency band. An amplitude detector 3 detects the level of a signal subject to amplification and a signal level change direction detection means 7 detects the direction of change in the level of the signal. A signal level change control means 4–8 stores the correspondence between the signal level and the mode of changing the signal in order to compensate for distortion for when the direction of change in the signal level is positive and when it is negative, and controls a signal change means 9 so that the amplitude and phase of the signal is changed in a mode of changing the signal corresponding to the detected direction of change in the signal level and the detected signal level. A signal change control content updating means 11–13 updates the content of this correspondence so that the distortion contained in the signal after amplification is reduced.

18 Claims, 15 Drawing Sheets

DISTORTION COMPENSATOR

BACKGROUND OF THE INVENTION

1. Field of the Invention

This invention relates to a distortion compensator that compensates for distortion that arises in an amplifier that amplifies signals and particularly to a distortion compensator that effectively compensates for unbalanced third order distortion in a higher frequency band and a lower frequency band.

2. Description of the Prior Art

Common amplifiers are used to amplify CDMA (Code Division Multiple Access) signals and multi-carrier signals, and attempts have been made to compensate for the distortion that arises in common amplifiers, thereby achieving low power consumption.

Techniques for performing distortion compensation include, for example, feedforward type distortion compensation and predistortion type distortion compensation, but in recent years, reducing the power consumption even further has become one goal with respect to predistortion.

FIG. 10 shows an example of an amplifier equipped with a distortion compensation circuit that adopts a predistortion scheme.

In the amplifier shown in this figure, a predistortion circuit 31 is provided as the stage prior to the main amplifier 32, and this predistortion circuit 31 generates in advance distortion with the same amplitude and a phase shifted by 180 degrees away from (namely having the phase opposite of) that of the distortion generated by the main amplifier 32, and outputs this distortion to the main amplifier 32. Thus, the distortion generated by the predistortion circuit 31 cancels the distortion generated by the main amplifier 32, thereby compensating for this distortion.

With such an amplifier, there is no circuit added as a stage after the main amplifier 32, so there is no loss and high efficiency can be achieved. However, with such an amplifier, it is necessary for the distortion generated by the predistortion circuit 31 to match the distortion generated by the main amplifier 32 over the entire frequency characteristics of signal input fluctuations and distortion.

Here, the distortion of the signal amplified by the amplifier is understood to be caused by AM—AM (Amplitude Modulation—Amplitude Modulation) conversion and AM-PM (Amplitude Modulation-Phase Modulation) conversion.

FIG. 11($a$) illustrates one example of AM—AM conversion in a typical amplifier, where the horizontal axis indicates the input level to the amplifier, while the vertical axis indicates the gain in the amplifier. FIG. 11($a$) shows the ideal gain characteristic $G_1$, the amplifier's gain characteristic $G_2$ and the predistortion circuit's gain characteristic $G_3$, so it is necessary to set the gain characteristics such that the sum of the predistortion circuit's gain characteristic $G_3$ and the amplifier's gain characteristic $G_2$ becomes the ideal gain characteristic $G_1$.

In addition, FIG. 11($b$) illustrates one example of AM-PM conversion in a typical amplifier, where the horizontal axis indicates the input level to the amplifier, while the vertical axis indicates the output phase of the amplifier. FIG. 11($b$) shows the ideal phase characteristic $P_1$, the amplifier's phase characteristic $P_2$ and the predistortion circuit's gain characteristic $P_3$, so it is necessary to set the phase characteristics such that the sum of the predistortion circuit's phase characteristic $P_3$ and the amplifier's phase characteristic $P_2$ becomes the ideal phase characteristic $P_1$.

However, as shown in FIGS. 11($a$) and ($b$), the characteristics of AM—AM conversion and AM-PM conversion are extremely complex so in order to achieve the ideal characteristics described above and obtain a distortion-free amplifier, the characteristics of the predistortion circuit becomes a complex function type, so it is realistically very difficult to obtain the coefficients of the characteristic curves by analog methods or by calculation.

To solve this problem, as an example of the constitution of another amplifier equipped with a distortion compensation circuit that adopts predistortion, one with the constitution shown in FIG. 12 has been studied.

With the amplifier shown in the figure, input signals, e.g. signals in the radio frequency (RF) band, are split by a splitter 41 and one branch of the split signal is output via a delay circuit 42 to an amplitude/phase circuit 47, while the other branch of the split signal is output to an amplitude detector (envelope detector) 43.

The amplitude detector 43 detects the amplitude level (envelope level) of the other branch of the split signal, and the result of this detection is converted by an analog-to-digital (A/D) converter 44 from an analog signal to a digital signal and output to a table block 45.

The table block 45 stores in memory amplitude correction data for correcting the amplitude and phase correction data for correcting the phase in the form of a table keyed on the amplitude level, and performs a lookup in this table to read out amplitude correction data and phase correction data corresponding to the results of detection of the amplitude level input from the A/D converter 44, and output it to a digital-to-analog (D/A) converter 46. The D/A converter 46 converts the amplitude correction data and phase correction data input from the table block 45 from digital signals to analog signals which are output to the amplitude/phase circuit 47.

The one branch of the split signal output from the splitter 41 to the delay circuit 42 is delayed by the delay circuit 42 so as to achieve synchronization with the timing at which the amplitude correction data signal and phase correction data signal corresponding to the amplitude level of the other branch of the split signal (that corresponding to the one branch of the split signal) due to the aforementioned processing system consisting of the amplitude detector 43, A/D converter 44, table block 45 and D/A converter 46.

Due to this delay, in the amplitude/phase circuit 47, the one branch of the split signal input to the amplitude/phase circuit 47 is given amplitude distortion based on the amplitude correction data corresponding to the amplitude level of the one branch of the split signal and phase distortion based on the phase correction data corresponding to the amplitude level of the one branch of the split signal. Here, as the amplitude distortion and phase distortion given to the one branch of the split signal, distortion that is able to cancel the amplitude distortion and phase distortion arising in the main amplifier 48 is generated. To wit, as shown in FIGS. 11($a$) and ($b$), the characteristics of the main amplifier 48 correspond to causing AM—AM conversion and AM-PM conversion depending on the input level, so amplitude correction data and phase correction data that is able to apply the opposite characteristics are set in the table block 45, so thereby, the ideal distortion-less state can be achieved for the entire amplifier.

To wit, the signal output from the amplitude/phase circuit 47 is amplified by the main amplifier 48 and at this time, the amplitude distortion and phase distortion generated by the main amplifier 48 are cancelled by the amplitude distortion and phase distortion given by the amplitude/phase circuit 47, so a distortion-free amplified signal is output from the main amplifier 48 via a splitter 49.

In addition, the splitter 49 splits off a portion of the amplified signal input from the main amplifier 48 and this split signal is output to a distortion detector 50.

The distortion detector 50 detects any distortion components remaining in the split signal input from the splitter 49 after distortion compensation, and outputs the result of this detection to a table update circuit 51.

The table update circuit 51 calculates the amplitude correction data and phase correction data that minimizes the distortion components contained in the split signal obtained from the splitter 49 based on the results of detection input from the distortion detector 50, and thus rewrites the values of the amplitude correction data and phase correction data stored in the table block 45 with optimal values. By using such a feedback system to update the amplitude correction data and phase correction data in this manner, it is possible to obtain an amplifier that is able to operate effectively regardless of the effects of changes due to temperature or changes due to aging, for example.

FIG. 13 shows one example of the values (table values) of the amplitude correction data and phase correction data output from the table block 45 when the amplitude correction data and phase correction data stored in the table block 45 are optimal values, for example, where the horizontal axis indicates the envelope level of the RF signal which is the input signal (=output level from the delay circuit 42), while the vertical axis pointing upward in the figure indicates the table values and the vertical axis pointing downward in the figure indicates the time.

To wit, this figure consists of the graph consisting of the horizontal axis and downward-pointing vertical axis that indicates the relationship between time and the RF signal's envelope level, and the graph consisting of the horizontal axis and upward-pointing vertical axis that indicates the relationship between table values and the RF signal's envelope level. Thus, when the RF signal's envelope level with respect to time varies as shown in the figure, the table value shown in the figure corresponding to this envelope level at various times is read out and output from the table block 45.

However, there is a problem in that a typical characteristic of amplifiers is that the distortion generated is frequency dependent.

In order to simplify the explanation, FIG. 14 illustrates an example of the main signal and distortion output on two frequencies from an amplifier when the two frequencies consisting of a main signal with a frequency $f_1$ and a main signal with a frequency $f_2$ are provided as input to the amplifier, where the horizontal axis indicates the frequency and the vertical axis indicates the amplitude level of the signal. The distortion shown here is presented as components due to intermodulation (IM) distortion and the like, showing the lower third order distortion at the frequency $(2 \cdot f_1 - f_2)$ and the higher third order distortion at the frequency $(2 \cdot f_2 - f_1)$. Note that in this Specification, it is assumed that $f_2 > f_1$.

As shown in the figure, when the amplitude levels of the two main signals are identical, the amplitude level A of the lower third order distortion at the frequency $(2 \cdot f_1 - f_2)$ and the amplitude level B of the higher third order distortion at the frequency $(2 \cdot f_2 - f_1)$ differ by an amount $\Delta IM$ ($=B-A$). When such a difference $\Delta IM$ arises, there is a problem in that even if the predistortion circuit of an amplifier such as that shown in FIG. 10 above or FIG. 12 above is operating ideally, it performs the same distortion compensation process over all frequencies, so it is unable to compensate for the components of this difference, so they remain within the signal after distortion compensation.

Note that this difference $\Delta IM$ arises due to causes other than the causes of the distortion that typically arise in an amplifier, and regarding the typical third order distortion components that arise in an amplifier, for example, the amplitude levels of distortion are the same at the lower frequency $(2 \cdot f_1 - f_2)$ and the higher frequency $(2 \cdot f_2 - f_1)$.

The characteristics of the third order distortion components which are the typical distortion components are the opposite characteristics of the characteristics of the predistortion circuit, so even if complete compensation is achieved the $\Delta IM$ portion cannot be compensated. As one example if A=1.0, B=0.8 and $\Delta IM$=2 dB=0.2 then the distortion components outside the typical distortion components become 0.1, and the typical distortion components become $\{B+(A-B)/2\}$=0.9. Moreover, because the distortion components outside the typical distortion components remain after compensation, the amount of distortion compensation is only $|20 \log(0.1/0.9)|$=19 dB. In addition, the amount of distortion compensation becomes even worse if the magnitude of $\Delta IM$ is large.

Note that various causes are conceivable for this $\Delta IM$ arising. For example, one conceivable cause is that the odd order distortion arising in the transistors making up the main amplifier causes distortion in the difference frequency $(f_2 - f_1)$, and then the input signals on frequency $f_1$ and frequency $f_2$ are again modulated by the transistor distortion. This is particularly conspicuous if fluctuation in the drain current is large as in a Class AB amplifier. In addition, another cause may be a similar case in which frequencies with double-frequency output components such as the frequency $(2 \cdot f_1)$ and the frequency $(2 \cdot f_2)$ are mixed with the $(f_2)$ portion and $(f_1)$ portion.

As described above, with a conventional amplifier equipped with a predistortion type distortion compensation function, for example, there is a problem in that unbalance differences occur between the higher third order distortion and lower third order distortion that arise in the amplifier, so the higher third order distortion and lower third order distortion cannot be compensated for accurately.

The present invention came about in order to solve the problems with the prior art in this manner and has as its object to provide a distortion compensator that is able to improve the unbalance of higher third order distortion and lower third order distortion that arises in the case of using an amplifier to amplify signals on two or more frequencies.

Note the present inventors had previously proposed the "Distortion Improvement Circuit" recited in the publication of unexamined Japanese patent application (Kokai) No. JP-A-2001-133496, so we shall briefly describe this here.

In this proposal, in order to improve the unbalance in higher third order distortion and lower third order distortion that arises when amplifying signals on two or more frequencies with an amplifier, pulse modulation (PM) is performed at a difference frequency (beat frequency) with respect to this signal. In addition, amplitude modulation (AM may also be performed instead of phase modulation, or both phase modulation and amplitude modulation may also be performed.

For reference, FIG. 15 presents an example of the constitution of an amplifier wherein a phase modulator or amplitude modulator or both are added to a distortion compensation circuit such as that shown in FIG. 12 above. This amplifier consists of a splitter 61, delay circuit 62, envelope detector (amplitude detector) 63, A/D converter 64, table block 65, D/A converter 66, amplitude/phase circuit 67, square-law detector 68, level adjuster 69, modulator 70, main amplifier 71, splitter 72, distortion detector 73 and a table update circuit 74. Here, the modulator 70 may consist of a phase modulator or an amplitude modulator or both. In addition, in this embodiment, a signal with frequency $f_1$ and a signal with frequency $f_2$ are input.

The splitter 61, delay circuit 62, envelope detector 63, A/D converter 64, table block 65, D/A converter 66, amplitude/phase circuit 67, main amplifier 71, splitter 72, distortion detector 73 and table update circuit 74 perform the same operations with the same constitution as the corresponding components of FIG. 12 above. Here, in this embodiment, the signal split by the splitter 61 is output to both the envelope detector 63 and square-law detector 68, and the signal in which distortion is caused by the amplitude/phase circuit 67 is output to the modulator 70, while the signal modulated by modulator 70 is output to the main amplifier 71.

The square-law detector 68 performs square-law detection of the signal input from splitter 61 and the frequency $\Delta f = (f_2 - f_1)$ signal components ($\Delta f$ components) are output to the level adjuster 69.

The level adjuster 69 may consist of an amplifier, for example, so that the $\Delta f$ components input from the square-law detector 68 are amplified and output to the modulator 70 as a modulation signal. Note that the level adjuster 69 may also consist of an attenuator, for example, and in this case, the $\Delta f$ components input from the square-law detector 68 are attenuated and output to the modulator 70 as a modulation signal.

The modulator 70 takes the $\Delta f$ components input from the level adjuster 69 to be a modulation signal (control signal), and performs phase modulation or amplitude modulation or both on the signal input from the amplitude/phase circuit 67 based on these $\Delta f$ components and outputs the modulated signal to the main amplifier 71.

With this constitution, the sum of the lower third order distortion of the frequency $(2 \cdot f_1 - f_2)$ and the higher third order distortion of the frequency $(2 \cdot f_2 - f_1)$ generated in the signal by the amplitude/phase circuit 67, and the lower sideband of the frequency $(2 \cdot f_1 - f_2)$ and the higher sideband of the frequency $(2 \cdot f_1 - f_2)$ generated in the signal by the modulator 70, is made so that it has the same amplitude but a phase 180 degrees away from that of the lower third order distortion of the frequency $(2 \cdot f_1 - f_2)$ and the higher third order distortion of the frequency $(2 \cdot f_1 - f_2)$ generated by the main amplifier 71, thereby compensating for the distortion arising in the main amplifier 71.

Here, in the current state, with an amplifier such as that shown in FIG. 15 above, it is not easy to determine the modulation level and phase of the level adjuster 69 which determines the modulation levels and phase of the phase modulator or amplitude modulator or both, depending on the states of various inputs, and for this reason, level adjustment is performed by a method that is as simple as using a first-order slope wherein the output increases as the input increases, for example, and in this state, it is difficult to completely cancel the IM unbalance. In addition, with an amplifier such as that shown in the figure, the amplitude/phase circuit 67 and modulator 70 which have similar functions are provided consecutively in the column direction, so combining these two functions is thought to be even more preferable.

The present invention described below is intended to improve these areas.

SUMMARY OF THE INVENTION

In order to achieve the aforementioned object, with the distortion compensator according to the present invention, the distortion arising in an amplifier that amplifies a signal is compensated as described below.

To wit, a signal change control means stores the correspondence between the signal level and the mode of changing the signal for distortion compensation in the case that the direction of change in the signal level is the positive direction, and also stores the correspondence between the signal level and the mode of changing the signal for distortion compensation in the case that the direction of change in the signal level is the negative direction.

Moreover, the signal level detection means detects the level of the signal subject to amplification by the amplifier, the signal level change direction detection means detects whether the direction of change in the level of the signal subject to amplification by the amplifier is the positive direction or the negative direction, and based on the stored content of these two correspondences, the signal change control means controls the signal change means such that it changes the signal subject to amplification by the amplifier in a mode of changing the signal corresponding to the direction of change in the signal level detected by the signal level change direction detection means and the signal level detected by the signal level detection means, and the signal change means changes one or both of the amplitude and phase of the signal subject to amplification by the amplifier.

Note that multi-carrier signal or other signal consisting of a plurality of frequency components, for example, may be used as the signal subject to amplification by the amplifier, and the amplifier generates asymmetric distortion in a higher frequency band and lower frequency band with respect to the signal subject to amplification.

Accordingly, in comparison to the case as in the prior art in which distortion compensation is performed based on the same correspondence between the signal level and mode of changing the signal for distortion compensation regardless of whether the direction of change in the signal level is the positive direction or negative direction, it is possible to make the content of the correspondence between the signal level and the mode of changing the signal for distortion compensation different for the case in which the direction of change in the signal level is the positive direction and for the case of the negative direction, so in the case of amplifying a signal containing two or more frequencies, for example, it is possible to perform distortion compensation accurately without generating unbalances between the higher third order distortion and lower third order distortion.

In addition, even if there is not strict synchronization between the timing of the signal processed by the signal change means and the timing at which the signal change means is controlled by the signal change control means based on the level of this signal, distortion compensation can be performed with good accuracy.

Here, various signals can be used as the signal subject to amplification by the amplifier.

In addition, various frequencies can be used as the frequency of the signal subject to amplification by the amplifier, and various numbers may be used as the number of frequency components constituting this signal.

In addition, various amplifiers may be used as the amplifier, as it may consist of a single amplification device, for example, or it may consist of a combination of a plurality of amplification devices. As an example, a common amplifier that is able to amplify a signal consisting of a plurality of frequencies together may be used as the amplifier.

In addition, various degrees of accuracy may be used as the accuracy of compensation of distortion occurring in the amplifier as long as they are effective in practice.

In addition, with the signal change means, it is possible to change only the amplitude of the signal or only the phase of the signal, or it is possible to change both the amplitude and phase of the signal. For example, a variable attenuator that attenuates the signal or a variable amplifier that amplifies the signal may be used as the means of changing the amplitude of the signal, while a phase shifter that changes the phase of the signal may be used as the means of changing the phase of the signal.

In addition, when trying to change the amplitude and phase of the signal by a phase change means, vector adjustment processing that changes the amplitude or phase of the signal is achieved.

In addition, various levels may be used as the level detected by the signal level detection means; for example, the amplitude level or power level or the like may be used.

In addition, if the direction of change in the level of the signal subject to amplification by the amplifier is the positive direction, this may be equivalent to the level of this signal increasing with the passage of time, for example, and on the other hand, if the direction of change in the level of the signal subject to amplification by the amplifier is the negative direction, this may be equivalent to the level of this signal decreasing with the passage of time, for example.

The signal change control means stores the correspondence between the signal level and the mode of changing the signal for distortion compensation in the case that the direction of change in the signal level is the positive direction, and in the case that the direction of change in the signal level is the negative direction.

In addition, the means of storing these two correspondences may be constituted using memory, for example. In this case, these two correspondences may be stored in different storage regions of the same memory, or they may be stored in different memories.

In addition, various types of content can be used as the content of these correspondences. For example, various signal levels may be used as the signal level, and various modes may be used as the mode of changing the signal for distortion compensation.

In addition, the mode of changing the signal for distortion may involve, for example, the amount of signal attenuation, the amount of signal amplification or otherwise the amount of change in the amplitude of the signal, the amount of change in the phase of the signal, or both may be used.

As a preferred configuration of the distortion compensator according to the present invention feedback control is exerted on the content of the correspondence stored by the signal level change control means as described below.

To wit, a signal change control content updating means updates the content of the correspondence between the signal level and mode of changing the signal for distortion compensation stored by the signal level change control means so that the distortion contained in the signal after being amplified by the amplifier is reduced.

Accordingly, by updating the content of the correspondence between the signal level and mode of changing the signal for distortion compensation stored by the signal level change control means, it is possible to reduce distortion contained in the signal after amplification by the amplifier, so the accuracy of distortion compensation can be kept high.

Here, the distortion contained in the signal after amplification by the amplifier may be reduced by various degrees as long as the degree of reduction is effective in practice.

In addition, as the mode of updating the content of correspondence between the signal level and the mode of changing the signal for distortion compensation stored by the signal level change control means may be updating the content of correspondence in the case that the direction of change in the signal level is the positive direction, or updating the content of correspondence in the case that the direction of change in the signal level is the negative direction, or updating the content of both of these correspondences.

With the distortion compensator according to the present invention, distortion arising in the amplifier that amplifies a signal is compensated as follows.

To wit, the signal level change control means stores the correspondence between the signal level and the mode of changing the signal for distortion compensation.

Then, the signal level detection means detects the level of the signal subject to amplification by the amplifier, and based on the content thus stored, the signal level change control means controls the signal change means such that it changes the signal subject to amplification by the amplifier in a mode of changing the signal corresponding to the signal level detected by the signal level detection means, and the signal change mode changes the amplitude or phase or both of the signal subject to amplification by the amplifier.

In addition, the signal change control content updating means updates the content of the correspondence between the signal level and mode of changing the signal for distortion compensation stored by the signal level change control means so that the distortion contained in the signal after being amplified by the amplifier is reduced.

In addition, in this configuration, the timing of signals processed by the signal change means is asynchronous (not the same time) from the timing of controlling the signal change means based on the level of this signal by the signal change control means.

Note that the signal subject to amplification by the amplifier may be a signal consisting of a plurality of frequency components, for example, and the amplifier generates asymmetric distortion in a higher frequency band and lower frequency band with respect to the signal subject to amplification.

Accordingly, when strict synchronization is performed as in the prior art, for example, the content of correspondence between the signal level and mode of changing the signal for distortion compensation is shifted to one with poor accuracy, but if strict synchronization is eliminated, it is possible to move this in the direction of better accuracy, namely the direction of better distortion compensation. For this reason, in the case of amplifying a signal with two or more frequencies with an amplifier, no unbalance occurs between the higher third order distortion and lower third order distortion, and the content of this correspondence can be made to handle this unbalance, so distortion compensation can be performed accurately.

Here, by making the timing of signals processed by the signal change means asynchronous from the timing of controlling the signal change means based on the level of this signal by the signal change control means, in the case of processing a certain signal component with the signal change means for example, this is equivalent to shifting the time at which the signal change means is controlled in the mode of changing the signal corresponding to the level of that certain signal component.

In addition, various modes may be used as the mode of making this asynchronous; for example, a mode in which no particular synchronization is performed may be used, and the magnitude of the shift from synchronization may be various magnitudes.

In addition, the distortion compensator according to the present invention as described above may be applied to a base station unit or a relay/amplification station unit of a mobile communications system, for example.

As one example, with the base station unit according to the present invention, the distortion compensator as described above is provided and the distortion arising in the amplifier that amplifies the signal to be sent is compensated for by this distortion compensator.

Here, various signals may be used as the signals subject to sending. For example, the signals sent to a mobile station unit with which a base station unit communicates may be used.

In addition, various systems such as cellular phone systems or Personal Handy phone Systems (PHS) may be used as the mobile communications system.

In addition, various communication protocols can be used as the communication protocol; for example, Code Division Multiple Access (CDMA), Time Division Multiple Access (TDMA), Frequency Division Multiple Access (FDMA) or other communications protocols may be used.

DESCRIPTION OF THE PREFERRED EMBODIMENTS

Here follows a description of preferred embodiments of the present invention made with reference to the figures.

We shall first describe Preferred Embodiment 1.

Figure 1:
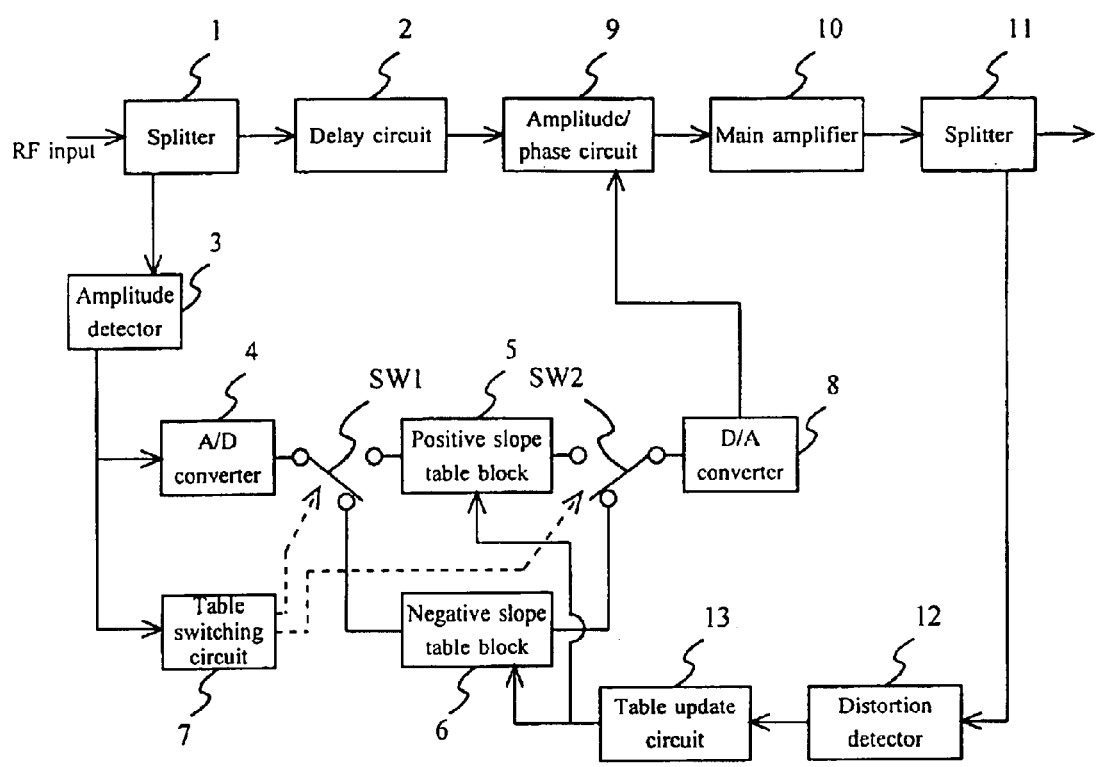
FIG. 1 is a diagram of an example of a predistortion type distortion compensating amplifier according to a preferred embodiment of the present invention.

FIG. 1 shows an example of an amplifier provided with a distortion compensation circuit that adopts predistortion (a predistortion type distortion-compensated amplifier) as an example of an amplifier provided with the distortion compensator according to the present invention. The amplifier according to this embodiment is provided in the base station unit of a mobile communications system, serving to amplify a multi-carrier signal that is sent to mobile station units, and at this time distortion including the IM unbalance components that arise in the amplifier are compensated.

The amplifier according to this embodiment consists of a splitter 1, delay circuit 2, amplitude detector 3, A/D converter 4, positive slope table block 5, negative slope table block 6, two switches SW1 and SW2, a table switching circuit 7, D/A converter 8, amplitude/phase circuit 9, main amplifier 10, splitter 11, distortion detector 12 and a table update circuit 13.

Figure 12:
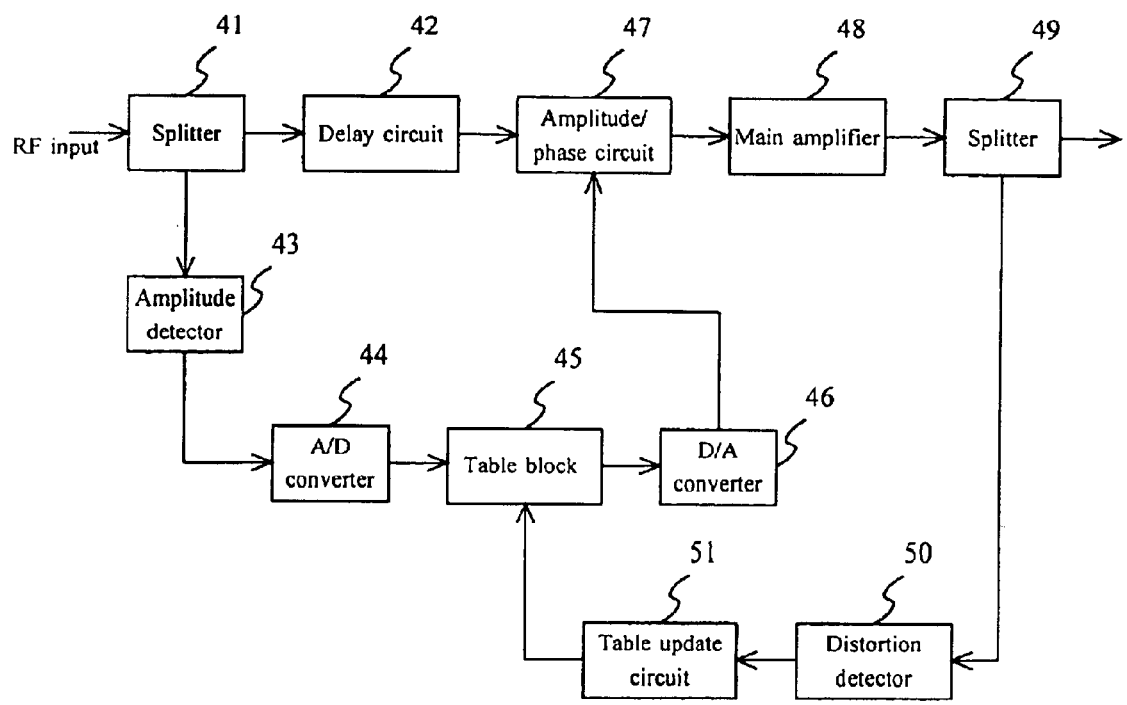
FIG. 12 is a diagram of an example of a conventional predistortion type distortion-compensated amplifier.
Figure 13:
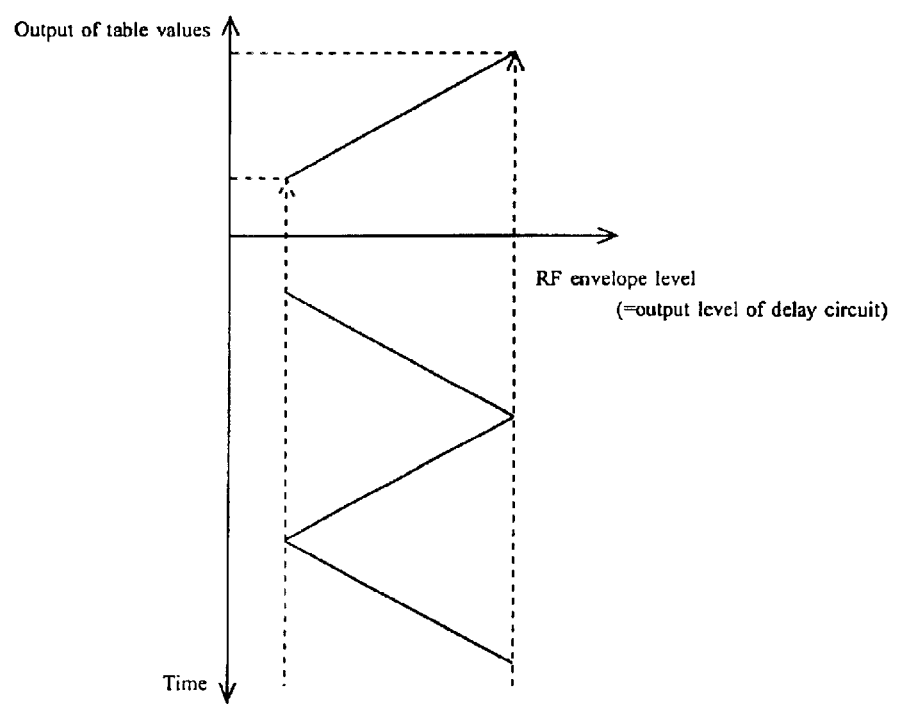
FIG. 13 is a diagram of an example of the values of amplitude correction data and phase correction data output from the table block.
Figure 14:
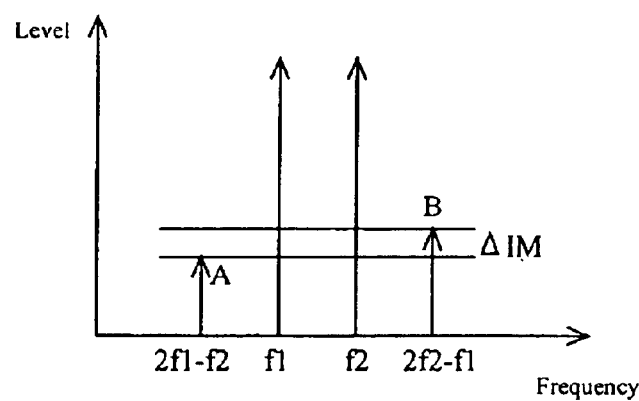
FIG. 14 is a diagram of an example of signals output from the amplifier when a two-frequency main signal is input.
Figure 15:
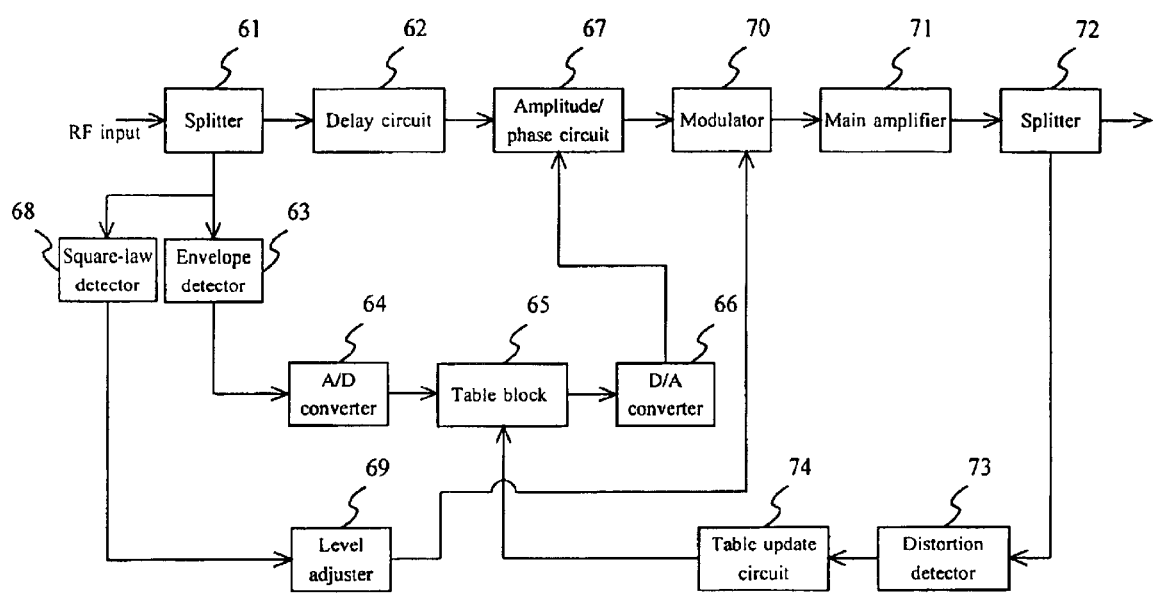
FIG. 15 is a diagram of an example of a conventional predistortion type distortion-compensated amplifier.

Here, the splitter 1, delay circuit 2, A/D converter 4, D/A converter 8, amplitude/phase circuit 9, main amplifier 10, splitter 11 and distortion detector 12 perform the same operations with the same constitution as the corresponding components of FIG. 12 above, so a detailed description is omitted.

The amplitude detector 3 detects the amplitude level (envelope level) of the split signal input from the splitter 1 and outputs the results of this detection to the A/D converter 4 and table switching circuit 7.

The positive slope table block 5 stores in memory amplitude correction data for correcting the amplitude and phase correction data for correcting the phase corresponding to the case in which the output from the amplitude detector 3 is a positive slope, as a table (a positive slope table) keyed on the amplitude level. In addition, in the positive slope table block 5, a lookup of this table is performed to read out the amplitude correction data and phase correction data corresponding to the results of detection of the amplitude level input from the A/D converter 4 and output this data to the D/A converter 8.

The negative slope table block 6 stores in memory amplitude correction data for correcting the amplitude and phase correction data for correcting the phase corresponding to the case in which the output from the amplitude detector 3 is a negative slope, as a table (a negative slope table) keyed on the amplitude level. In addition, in the negative slope table block 6, a lookup of this table is performed to read out the amplitude correction data and phase correction data corresponding to the results of detection of the amplitude level input from the A/D converter 4 and output this data to the D/A converter 8.

Note that in the case that the output from the amplitude detector 3 has a positive slope, this is equivalent to the case in which the direction of change in this output level is the positive direction, but in the case that the output from the amplitude detector 3 has a negative slope, this is equivalent to the case in which the direction of change in this output level is the negative direction.

Switch SW1 is provided between the A/D converter 4 and the two table blocks 5 and 6, having the function of switching the input destination for the output from the A/D converter 4 between the positive slope table block 5 and the negative slope table block 6.

Switch SW2 is provided between the two table blocks 5 and 6 and the D/A converter 8, having the function of switching the table block that provides output to the D/A converter 8 between the positive slope table block 5 and the negative slope table block 6.

The table switching circuit 7 has the function of detecting the direction of the slope of the amplitude level input from the amplitude detector 3, and if this slope is detected to be positive, the two switches SW1 are switched to the side of the positive slope table block 5 so that the positive slope table block 5 is connected to the A/D converter 4 and D/A converter 8. On the other hand, if this slope is detected to be negative, the two switches SW1 are switched to the side of the negative slope table block 6 so that the negative slope table block 6 is connected to the A/D converter 4 and D/A converter block 8.

Based on the results of detection input from the distortion detector 12, the table update circuit 13 calculates the amplitude correction data and phase correction data for both the positive slope table block 5 and the negative slope table block 6 so that the distortion components contained in the split signal acquired from the splitter 11 are minimized, for example, and the results of this calculation are output to the respective table blocks 5 and 6, thereby overwriting the amplitude correction data and phase correction data stored in these two table blocks 5 and 6 with the optimal values.

In this manner, with the amplifier according to this embodiment, the two table blocks 5 and 6 are provided such that the case in which the output from the amplitude detector 3 is a positive slope is made different from the case in which the slope is negative. In addition, the switches SW1 and SW2 and table switching circuit 7 are provided in order to switch between these two table blocks 5 and 6. Moreover, the table switching circuit 7 switches the switches SW1 and SW2 so that the positive slope table block 5 is used in the case in which the output from the amplitude detector 3 indicates a positive slope, while the table switching circuit 7 switches the switches SW1 and SW2 so that the negative slope table block 6 is used in the case in which the output from the amplitude detector 3 indicates a negative slope. In addition, the table update circuit 13 performs the table update process on the two table blocks 5 and 6.

Here follows a description of an example of the table switching circuit 7.

Figure 2:
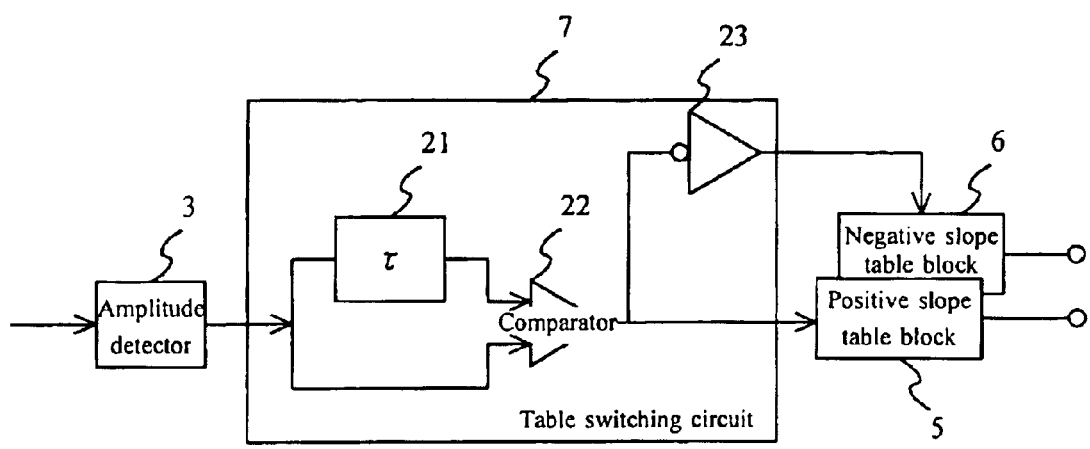
FIG. 2 is a diagram of an example of a table switching circuit.

FIG. 2 shows an example of the table switching circuit 7. Note that this figure illustrates an example in which the switches SW1 and SW2 are not used.

The table switching circuit 7 illustrated in the figure consists of a delay circuit 21, comparator 22 and NOT circuit 23.

In the table switching circuit 7 illustrated in the figure, a signal carrying amplitude information input from the amplitude detector 3 is divided into two, where one signal is input as is to the comparator 22, while the other signal is delayed by passing through delay circuit 21 and input to the comparator 22.

In addition, the comparator 22 compares the magnitude of the amplitude value based on the input signal that passes through the delay circuit 21 against the magnitude of the amplitude value based on the input signal that bypasses the delay circuit 21, and signals that represent the results of this comparison are output to the positive slope table block 5 and NOT circuit 23. Here, as signals that represent the comparison, for example, signals that use the value "1" or the value "0" to indicate whether the temporal direction of change in the amplitude value is the positive direction or the negative direction are used, so the NOT circuit 23 inverts the input value of "1" or "0" and outputs this to the negative slope table block 6.

In addition, in the illustrated example, the positive slope table block 5 and negative slope table block 6 are both connected to the output end of the A/D converter 4 and the input end of the D/A converter 8. Then in the positive slope table block 5 and negative slope table block 6, when one of the values among the preset values of "1" or "0" is input, correction data values based on the input from the A/D converter 4 is output to the D/A converter 8, while if the other value is input, no output of correction data values is performed. Specifically, the value "1" may indicate the positive direction while the value "0" may indicate the negative direction, for example, so the positive slope table block 5 and negative slope table block 6 may be configured so that correction data values are output when the value "1" is input.

With this configuration, by switching the output from the comparator 22 of the table switching circuit 7 between the value "1" and the value "0," it is possible to select either the positive slope table block 5 or the negative slope table block 6 and cause the output of correction data values.

Note that when applying the configuration illustrated in FIG. 1 above, it is possible to use the output from the comparator 22, for example, to control the switching of the two switches SW1 and SW2 and thus switch between the positive slope table block 5 and negative slope table block 6.

Here follows a detailed description of the distortion compensation performed by means of the amplifier according to this embodiment.

Figure 3:
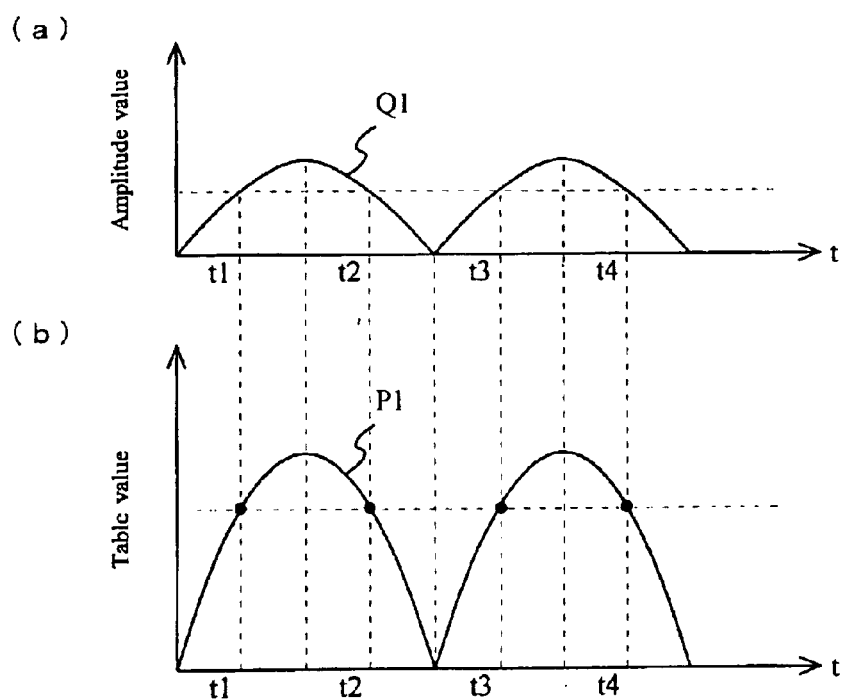
FIG. 3 is a diagram of an example of temporal changes in the amplitude values of the envelope of an input signal and an example of temporal changes in table values.

FIG. 3(a) illustrates an example of the temporal change in the input signal's amplitude value (envelope amplitude value) $Q_1$ in the case that a signal consisting of two single sine waves is input to the amplifier. Note that the horizontal axis shows the time t, while the vertical axis shows the amplitude value of the input signal.

In addition, FIG. 3(b) corresponds to FIG. 3(a) and illustrates an example of the temporal change in the table value $P_1$ stored in table block 45 in the case that only one table block 45 is provided as in the conventional amplifier shown in FIG. 12 above, for example. Note that the horizontal axis shows the time t, while the vertical axis shows the table values. These table values become the correction data values read out in the table block 45 upon input of an amplitude value via the A/D converter 44 to the table block 45 when the input signal amplitude values shown in FIG. 3(a) are detected by the amplitude detector 43.

As shown in FIG. 3(b), with the conventional table block 45, the table values at certain times $t_1$, $t_2$, $t_3$ and $t_4$ when the input signal amplitude values are identical become identical constant values as indicated by the "·" symbols in the figure. With such table values, perfect distortion compensation can be achieved if no IM unbalance occurs between the higher frequency band and lower frequency band, but in the event that such an IM unbalance occurs in the amplifier, perfect distortion compensation cannot be done with only these table values.

Figure 4:
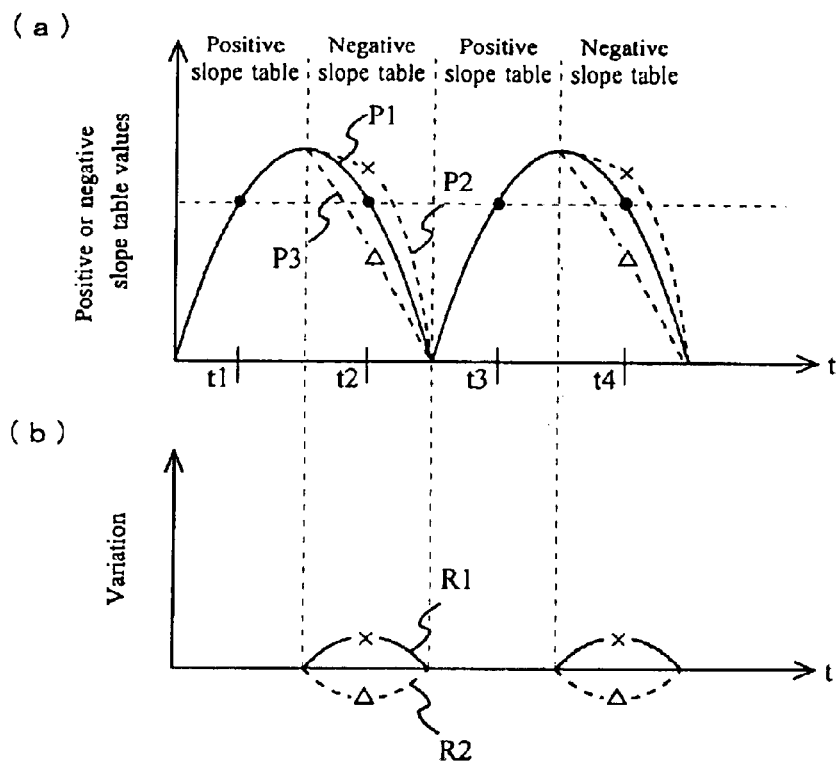
FIG. 4 is a diagram of an example of the table values of a negative slope table block.

FIG. 4(a) illustrates an example of the temporal change in the table values in the case that a signal consisting of two single sine waves is input to the amplifier according to this embodiment showing the table value $P_1$ of positive slope table block 5 as shown in FIG. 3(b) above, while also showing two examples $P_2$ and $P_3$ of the table values of negative slope table block 6 shifted from those table values. Note that the horizontal axis shows the time t, while the vertical axis shows the table values.

In the example of FIG. 4(a), when the output from amplitude detector 3 indicates a negative slope, a table value (correction data value) $P_2$ such as that indicated by the symbol "×" or a table value (correction data value) $P_3$ such as that indicated by the symbol "Δ" is written as the table value of the negative slope table block 6, and if the table value (correction data value) $P_1$ such as that indicated by the symbol "·" wherein complete distortion compensation is achieved as when there is no IM unbalance is taken to be a reference value, this is equivalent to writing the variations as shown in FIG. 4(b) to the negative slope table block 6 as table values.

FIG. 4(b) illustrates one example of the temporal change in the differences (variations) $R_1$ and $R_2$ between the table values $P_2$ and $P_3$ of the negative slope table block 6 shown in FIG. 4(a) and the table value $P_1$ serving as the reference. Note that the horizontal axis shows the time t, while the vertical axis shows the variations.

Regarding such variations, it is possible to cancel IM unbalances by performing either phase modulation or amplitude modulation or both. Here, this being "possible" rests on the condition that the phase state of the distortion that gives rise to IM unbalances must agree with the phase state of the variations shown in FIG. 4(b).

Figure 5:
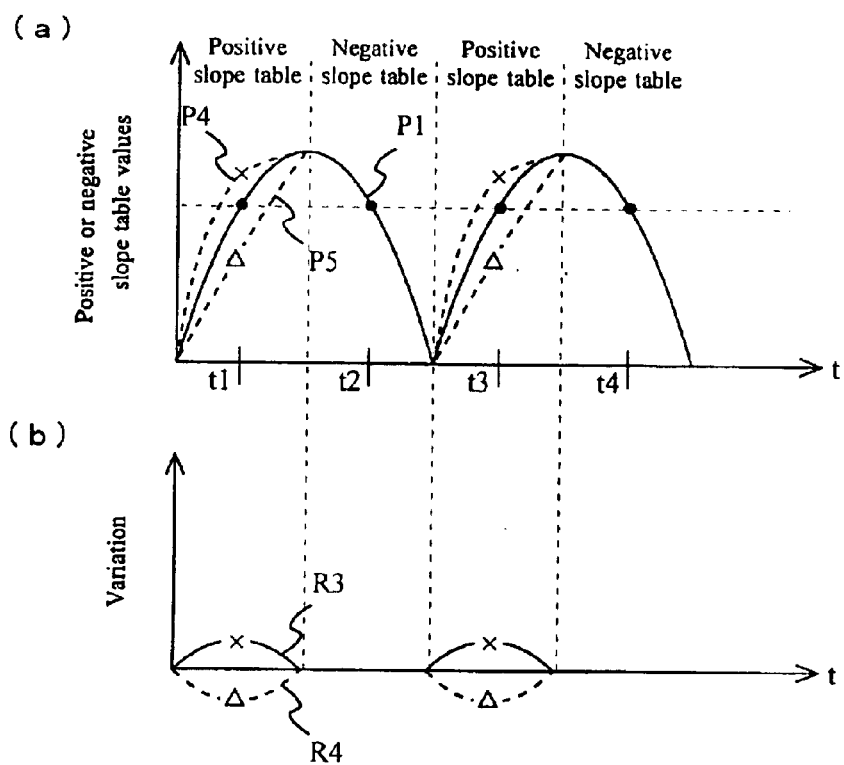
FIG. 5 is a diagram of an example of the table values of a positive slope table block.

FIG. 5(a) illustrates an example of the temporal change in the table values in the case that a signal consisting of two single sine waves is input to the amplifier according to this embodiment, showing the table value $P_1$ of negative slope table block 6 which is the same type of table value as shown in FIG. 3(b) above, while also showing two examples $P_4$ and $P_5$ of the table values of positive slope table block 5 shifted from those table values. Note that the horizontal axis shows the time t, while the vertical axis shows the table values.

In the example of FIG. 5(a), when the output from amplitude detector 3 indicates a positive slope, a table value (correction data value) $P_4$ such as that indicated by the symbol "×" or a table value (correction data value) $P_5$ such as that indicated by the symbol "Δ" is written as the table value of the positive slope table block 5, and if the table value (correction data value) $P_1$ such as that indicated by the symbol "·" wherein complete distortion compensation is achieved as when there is no IM unbalance is taken to be a reference value, this is equivalent to writing the variations as shown in FIG. 5(b) to the positive slope table block 5 as table values.

FIG. 5(b) illustrates one example of the temporal change in the differences (variations) $R_3$ and $R_4$ between the table values $P_4$ and $P_5$ of the positive slope table block 5 shown in FIG. 5(a) and the table value $P_1$ serving as the reference. Note that the horizontal axis shows the time t, while the vertical axis shows the variations.

Regarding such variations, it is possible to cancel IM unbalances by performing either phase modulation or amplitude modulation or both. Here, this being "possible" rests on the condition that the phase state of the distortion that gives rise to IM unbalances must agree with the phase state of the variations shown in FIG. 5(b).

Figure 6:
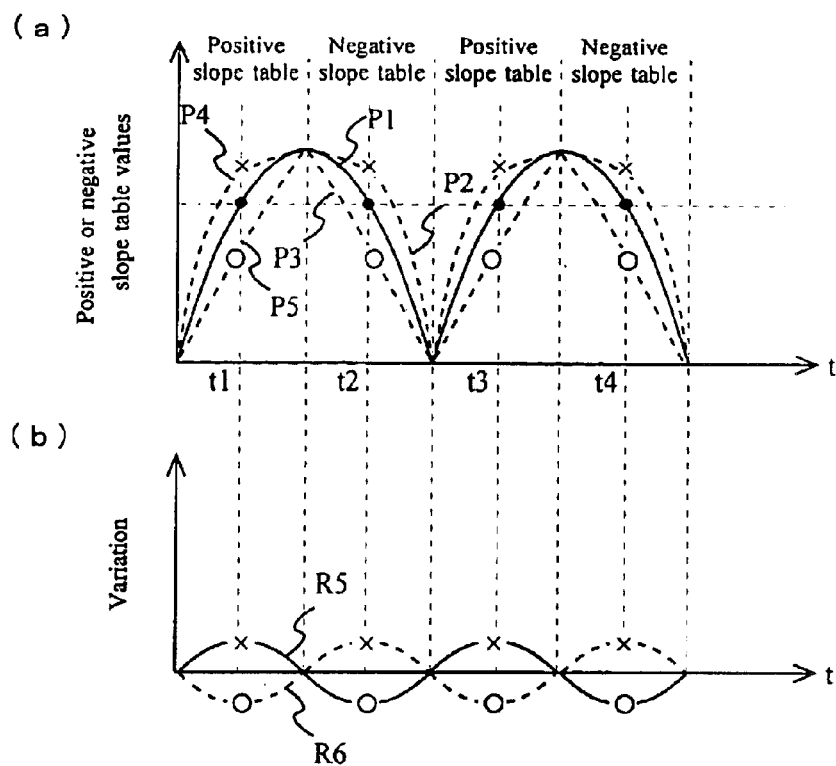
FIG. 6 is a diagram of an example of the table values of a positive slope table block and a negative slope table block.

FIG. 6(a) illustrates an example of the table values in the case of writing the table values $P_2$ and $P_3$ (indicated by the symbols "×" and "○" respectively) of negative slope table block 6 in the same manner as in FIG. 4(a) above as well as writing the table values $P_4$ and $P_5$ (indicated by the symbols "×" and "○" respectively) of positive slope table block 5 in the same manner as in FIG. 5(a) above, and also the reference table value $P_1$. Note that the horizontal axis shows the time t, while the vertical axis shows the table values.

In addition, FIG. 6(b) illustrates one example of the temporal change in the differences (variations) $R_5$ between the table value and the table value $P_1$ serving as the reference in the case of using the one table value $P_3$ of the negative slope table block 6 and the one table value $P_4$ of the positive slope table block 5 shown in FIG. 6(a) and also illustrates one example of the temporal change in the differences (variations) $R_6$ between the table value and the table value $P_1$ serving as the reference in the case of using the other table value $P_2$ of the negative slope table block 6 and the other table value $P_5$ of the positive slope table block 5. Note that the horizontal axis shows the time t, while the vertical axis shows the variations.

By writing table values to the positive slope/negative slope table blocks 5 and 6 depending on the positive/negative slope of the input signal's amplitude value and using one variation $R_5$ in this manner, it is possible to use the amplitude/phase circuit 9 to modulate the input signal with beat components (beat frequencies). In addition, in the event that it is necessary to invert the phase of the variations in order to use them to perform modulation, by using the other variation $R_6$, it is possible to use the amplitude/phase circuit 9 to modulate the input signal with beat components (beat frequencies).

Figure 7:
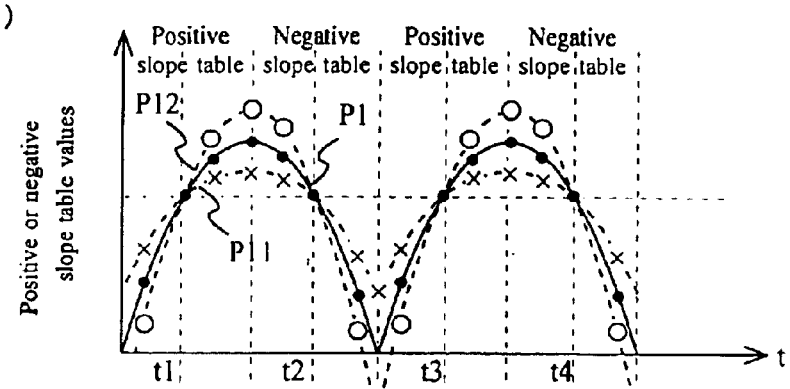
FIG. 7 is a diagram of an example of the table values of a positive slope table block and a negative slope table block.
Figure 7:
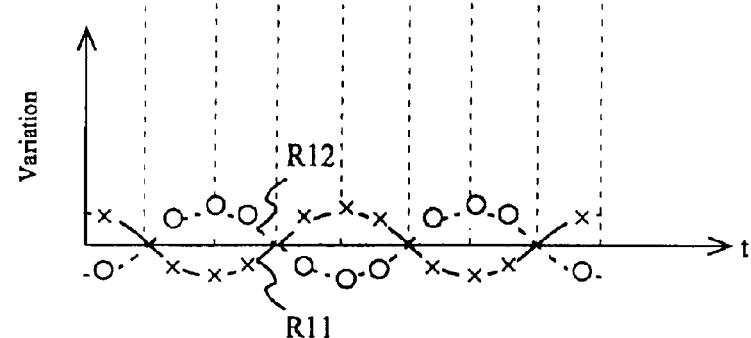

Moreover, as shown in FIGS. 7(a) and (b), it is possible to write table values corresponding to various functions as the table values of the negative slope table block 6 and the table values of the positive slope table block 5, and thereby, it is possible to perform modulation of the input signal with beat components of an arbitrary phase.

Here, on FIG. 7(a), two examples of table values $P_{11}$ and $P_{12}$ which make up the table values of the negative slope table block 6 and the table values of the positive slope table block 5 are indicated by the symbols "×" and "○" respectively. Note that the horizontal axis shows the time t, while the vertical axis shows the table values.

In addition, FIG. 7(b) illustrates one example of the temporal change in the differences (variations) $R_{11}$ between the table value $P_{11}$ and the table value $P_1$ serving as the reference in the case of using the one table value $P_{11}$ shown in FIG. 7(a) and also illustrates one example of the temporal change in the differences (variations) $R_{12}$ between the table value $P_{12}$ and the table value $P_1$ serving as the reference in the case of using the other table value $P_{12}$. Note that the horizontal axis shows the time t, while the vertical axis shows the variations.

Here, the amplitude value $Q_1$ shown in FIG. 3(a) above is the amplitude value of the envelope of the input signals in the radiofrequency (RF) band subject to amplification, and the frequency components of this envelope are equivalent to the frequency components of the IM components. In addition, the beat components are defined to be the same frequency components as the frequency components of the envelope, and modulation by means of beat components consists of performing phase modulation or amplitude modulation or both by means of the same frequency components as the frequency components of the envelope. In this embodiment, the process corresponding to such phase modulation or amplitude modulation or both is achieved by means of the amplitude change process or phase change process by means of the amplitude/phase circuit 9.

In addition, one cause of IM unbalance occurring in the amplifier is the reflection of double-frequency components and, depending on the state of reflection of these double-frequency components, there may be changes in the IM phase due to the effect of these double-frequency components. Note that while the details are omitted here, they are recited in the publication of the present inventors' unexamined Japanese patent application (Kokai) No. JP-A-2001-175647 entitled "Distortion Improvement Circuit." Since there is such reflection of double-frequency components, in the event that beat component-based phase modulation or amplitude modulation or both are performed, for example, it is necessary that the phase of the modulation wave (beat components) be easily changed.

Regarding this point, for example, with the method using the table values $P_{11}$ and $P_{12}$ as shown in FIG. 7(a) above, while conducting distortion compensation by feedback control, table values suited to the compensation of the IM unbalanced portion are automatically written to the positive slope table block 5 and negative slope table block 6. For this reason, with this method, the phase of the modulation wave (beat components) can be automatically varied arbitrarily, so it is an excellent method. When the table values $P_{11}$ and $P_{12}$ as shown in FIG. 7(a) above are used, all of the table values as indicated in FIG. 5(a) and FIG. 6(a) above can be achieved, so in comparison to this, even more detailed table value can be achieved.

With the amplifier according to this embodiment, the feedback system consisting of the splitter 11, distortion detector 12 and table update circuit 13 is used to exert control so that the distortion arising in the main amplifier 10 (namely the sum of the ideal distortion of the main amplifier 10 itself and the IM unbalance distortion) is minimized by writing the table values of the positive slope table block 5 and the table values of the negative slope table block 6. The distortion arising in the main amplifier 10 may be different depending on the type of main amplifier 10 or the like, but by performing feedback control according to this embodiment, the optimal table values depending on the state of occurrence of distortion in the main amplifier 10 can be written.

In this manner, with the amplifier according to this embodiment, regardless of the state of occurrence of IM unbalanced distortion in the main amplifier 10, the table values of the positive slope table block 5 and the table values of the negative slope table block 6 can be set finely depending on this state, so the mode of varying the amplitude or phase of the input signal can be set by the amplitude/phase circuit 9 to an appropriate mode.

Specifically, with the amplifier according to this embodiment, the table values of the positive slope table block 5 and the table values of the negative slope table block 6 are modified by the table update circuit 13 so that the distortion included in the signal output from the main amplifier 10 is minimized. Thereby, for example, one of the two table values $P_4$ or $P_5$ shown in FIG. 6(a) above or one of the two table values $P_{11}$ or $P_{12}$ shown in FIG. 7(a) above or table values similar to these are automatically set.

Note that in a configuration in which phase modulation and amplitude modulation, for example, are controlled by means of table values for phase modulation and table values for amplitude modulation, these respective table values become optimal table values. For this reason, the table values for phase modulation, for example, may become values with large amounts of variation while the table values for amplitude modulation may become values with virtually no variation, or vice versa.

Here follows a description of synchronization in the amplifier according to this embodiment.

Figure 8:
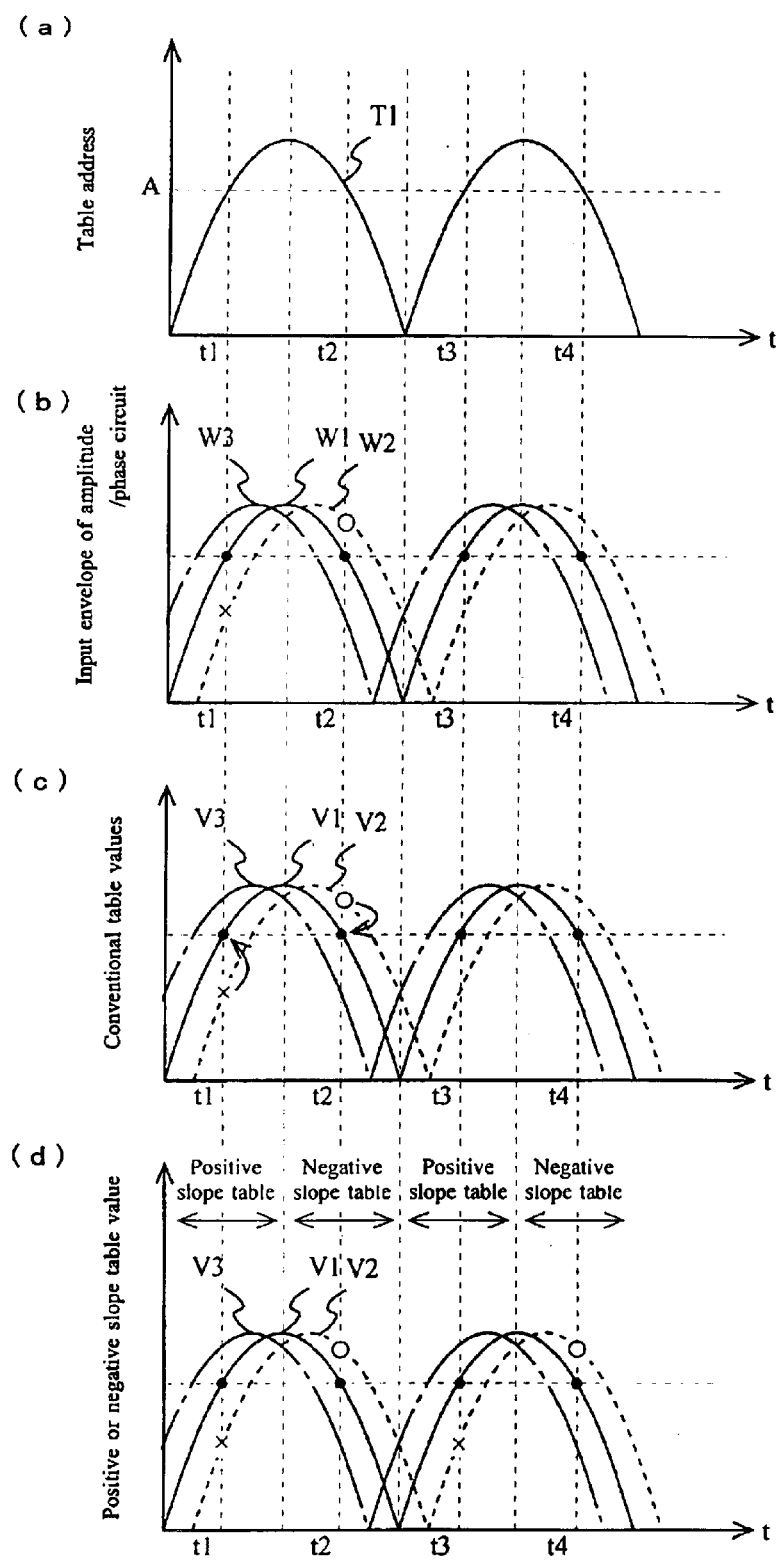
FIG. 8 is a diagram used to describe distortion compensation using the table values of a positive slope table block and a negative slope table block.

FIG. 8(a) illustrates an example of the temporal change in the address (e.g., the address value) $T_1$ at which the table value is read from the positive slope table block 5 or negative slope table block 6 in the case in which a signal consisting of two single sine waves is input to the amplifier according to this embodiment. Note that the horizontal axis shows the time t, while the vertical axis shows the addresses in the table blocks 5 or 6. In the example of FIG. 8(a), the table values stored at the same address A is read from the positive slope table block 5 and the negative slope table block 6, respectively, at the four times $t_1$, $t_2$, $t_3$ and $t_4$.

In addition. FIG. 8(b) corresponds to FIG. 8(a) and illustrates an example of the temporal change in the envelope of the signal input to the amplitude/phase circuit 9, showing an example of the temporal change in the envelope $W_1$ serving as the reference value, while also showing an example of two envelopes $W_2$ and $W_3$ shifted forward and backward from the envelope $W_1$. Note that the horizontal axis shows the time t, while the vertical axis shows the level of the envelope.

In addition. FIG. 8(c) corresponds to FIG. 8(b) and illustrates an example of the temporal change in the table values $V_1$ of the table block 45 used in a conventional amplifier such as that shown in FIG. 12 above for example. Note that the horizontal axis shows the time t, while the vertical axis shows the table values.

In the amplifier according to this embodiment and the amplifier shown in FIG. 12 above, the signal input from splitter 1 or 41 via delay circuit 2 or 42 to amplitude/phase circuit 9 or 47 (the signal on route 1) and the signal input from splitter 1 or 41 via amplitude detector 3 or 43, A/D converter 4 or 44, table blocks 5, 6, or 45 and D/A converter 8 or 46 to amplitude/phase circuit 9 or 47 (the signal on route 2) should ideally arrive at the same time. This is called synchronization.

Moreover, when synchronization is achieved between the signal on route 1 and the signal on route 2, in the amplifier shown in FIG. 12 above, the envelope of the signal input to amplitude/phase circuit 47 becomes like the envelope $W_1$ in FIG. 8(b), and the table values (correction data values) output from table block 45 become like the table values $V_1$ in FIG. 8(c). Specifically, as the table values $V_1$, when the time is $t_1$, $t_2$, $t_3$ or $t_4$, the data values indicated with the "·" symbols are output.

However, with the distortion compensation scheme of the amplifier shown in FIG. 12 above, even in the case in which synchronization of processing times is not achieved between the signal on route 1 and the signal on route 2, and the signal input to amplitude/phase circuit 47 is the temporally shifted envelope $W_2$ or $W_3$ as shown in FIG. 8(b), only the same table values (correction data values) can be stored at the times $t_1$, $t_2$, $t_3$ and $t_4$. For this reason, with the distortion compensation scheme of the amplifier shown in FIG. 12 above, it is not possible to store the regular correction data values (normal correction data values) $V_2$ and $V_3$ as indicated by the symbols "×" and "○" but instead, these regular correction data values $V_2$ and $V_3$ are averaged and the correction data values $V_1$ indicated by the "·" symbols are stored as the table values of table block 45.

In contrast, with the amplifier according to this embodiment, the positive slope table block 5 and negative slope table block 6 are provided separately, so as shown in FIG. 8(d), the regular correction data values $V_2$ and $V_3$ indicated by the symbols "×" and "○" for example can be stored as the table values of table blocks 5 and 6. This indicates that, where it had been necessary to perform strict synchronization between the signal on route 1 and the signal on route 2 in the prior art, for example, with the amplifier according to this embodiment, by providing a positive slope table block 5 and negative slope table block 6, high-precision distortion compensation can be achieved to an extent that is effective in practice even without performing strict synchronization control.

As described above, with the amplifier according to this embodiment, in the scheme in which distortion compensation of an amplifier is performed by amplitude correction and phase correction with respect to the envelope of the input signal, a determination is made as to whether the slope of the amplitude value of the input signal (amplitude value of the envelope) is positive or negative, and based on the results of this determination, the amplitude correction value or phase correction value stored in the positive slope table block 5 or negative slope table block 6 is used to perform distortion compensation. Note that it is possible to perform either amplitude correction or phase correction or both may be performed.

Accordingly, with the amplifier according to this embodiment, it is possible to effectively compensate for distortion in the main amplifier 10 in which an IM unbalance arises, so it is possible to remedy the unbalance between the higher frequency band and lower frequency band of the third order distortion arising in the main amplifier 10. In addition, with the amplifier according to this embodiment, even if there is not strict synchronization between the input signal subject to correction by the amplitude/phase circuit 9 and the correction value from the D/A converter 8 in order to control this correction, high-precision distortion compensation can be achieved to an extent that is effective in practice.

In this manner, with the amplifier according to this embodiment, by preparing separate correction tables for the case in which the amplitude value of the envelope of the input signal is a positive slope and the case in which it is a negative slope, even in the case in which there is an IM unbalance in the main amplifier 10, the effects of this IM unbalance can be effectively cancelled. In addition, with the amplifier according to this embodiment, the table can be easily implemented as an integrated circuit, for example, so low costs can be achieved.

Note that in this embodiment, the amplitude detector 3, delay circuit 2 and amplitude/phase circuit 9 are constituted such that they input signals in the radiofrequency (RF) band and process these input signals in the radiofrequency (RF) band region, but various frequency bands may be used as the frequency bands used as the frequency band of the input signals and frequency band for signal processing. Specifically, they may be constituted such that they input signals in a baseband band, for example, and estimate the amplitude (envelope) of the input signals in the baseband band region, and they may be constituted such that a delay is performed by digital processing, for example. In addition, the amplitude/phase circuit 9 can operate in an intermediate frequency (IF) range, for example, and it can also operate in a digital signal region.

Here, the amplifier according to this embodiment is provided with the functions of a distortion compensator that compensates for the distortion arising in the main amplifier 10.

Specifically, the signal change means is constituted by the functions of the amplitude/phase circuit 9, and the signal level detection means is constituted by the functions of the amplitude detector 3, while the signal level change direction detection means is constituted by the functions of the amplitude detector 3 and the function of the table switching circuit 7 detecting whether the slope of amplification of the signal is positive or negative. In addition, the signal change control means is constituted by the functions of the A/D converter 4, the function of the positive slope table block 5 storing the table values for positive slopes, the function of the negative slope table block 6 storing the table values for negative slopes, the function of the table switching circuit 7 and the two switches SW1 and SW2 switching these two table blocks 5 and 6 and the functions of the D/A converter 8. In addition, the signal change control content update means is constituted by the functions of the splitter 11, the functions of the distortion detector 12 and the functions of the table update circuit 13.

Here follows a description of Preferred Embodiment 2.

The amplifier according to this embodiment has roughly the same constitution as the amplifier shown in FIG. 12 above, for example, and is provided with one embodiment of the distortion compensator according to the present invention. Note that in this embodiment, for simplicity of explanation, the amplifier according to this embodiment will be described using the same symbols 41–51 as those given in FIG. 12 above.

The distortion compensator according to this embodiment compensates for distortion that arises in the main amplifier 48 which amplifies a signal as follows.

To wit, the table block 45 stores the correspondence between the signal level and the mode of varying the signal in order to compensate for distortion, and the amplitude detector 43 detects the level of the signal subject to amplification by the main amplifier 48. Moreover, based on the content stored in the table block 45, the distortion compensation mode control system consisting of the A/D converter 44, table block 45 and D/A converter 46 controls the amplitude/phase circuit 47 so that the signal subject to amplification by the main amplifier 48 is varied by the mode of changing the signal corresponding to the signal detected by the amplitude detector 43, and thus the amplitude/phase circuit 47 changes the amplitude or phase or both of the signal subject to amplification by the main amplifier 48.

In addition, with the amplifier according to this embodiment, the feedback control system consisting of the splitter 49, distortion detector 50 and table update circuit 51 updates the content of the correspondence between the signal levels and mode of changing the signal to compensate for distortion stored in the table block 45 so that the distortion contained in the signal after amplification by the main amplifier 48 is reduced.

In addition, with the amplifier according to this embodiment, no synchronization is done between the timing of the input signal processed by the amplitude/phase circuit 47 and the timing of controlling the amplitude/phase circuit 47 based on the level of this input signal by the distortion compensation mode control system 44, 45 and 46, so this synchronization may be considered an asynchronous state.

Here follows a detailed description of synchronization in the amplifier according to this embodiment.

In this embodiment no synchronization is done between the signal input from the splitter 41 via the delay circuit 42 to the amplitude/phase circuit 47 (the signal on route 1) and the signal used for amplitude/phase correction input from splitter 41 via the amplitude detector 43, A/D converter 44, table block 45 and D/A converter 46 (the signal on route 2).

Moreover, when no synchronization is done between the signal on route 1 and the signal on route 2, for example, if the envelope of the signal input to the amplitude/phase circuit 47 is the temporally shifted envelope $W_2$ or $W_3$ as shown in FIG. 8(b) above, the table values stored in table block 45 are found by averaging the regular correction data values $V_2$ and $V_3$ as indicated by the symbols "×" and "○" shown on FIG. 8(c) above to generate the correction data values $V_1$ indicated by the "·" symbols.

Here follows a study of the differences between the regular correction data values (normal correction data values) $V_2$ and $V_3$ and the correction data values $V_1$ stored in the table block 45 of this embodiment.

Figure 9:
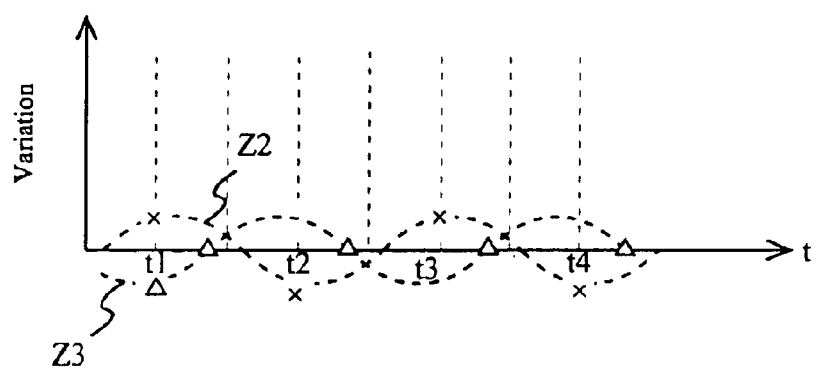
FIG. 9 is a diagram used to describe distortion compensation wherein the input signal and table values are asynchronous.
Figure 10:
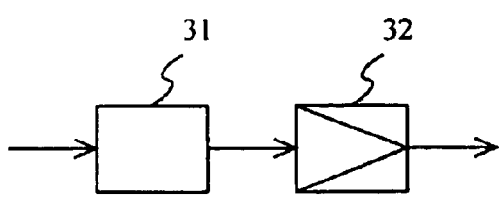
FIG. 10 is a diagram of an example of a conventional predistortion type distortion-compensated amplifier.
Figure 11:
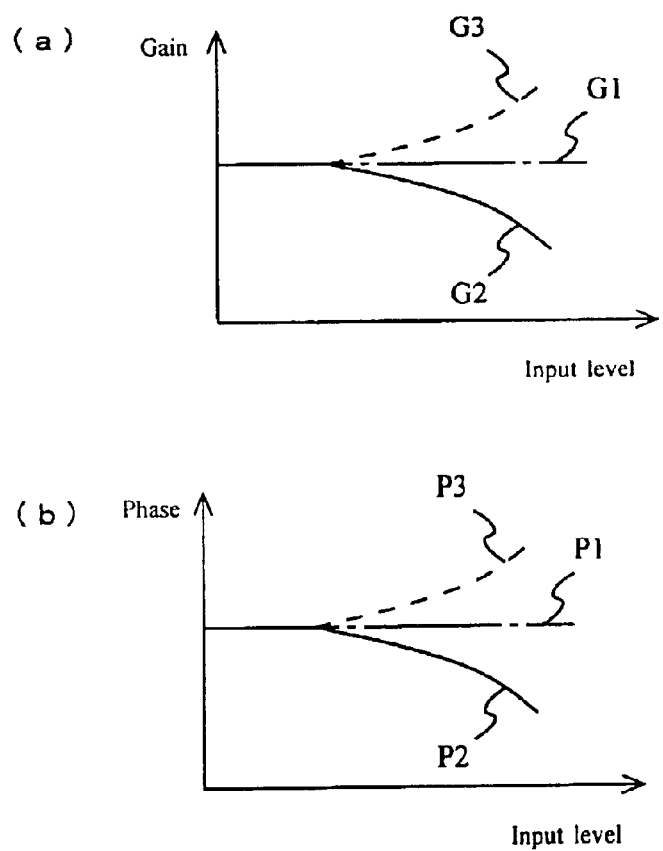
FIG. 11 is a diagram of an example of AM—AM conversion and AM-PM conversion in an amplifier.

FIG. 9 presents an example of the variations of the regular correction data values $V_2$ and $V_3$ from the correction data values $V_1$ stored in the table block 45, presented in the form of the data values (variation values) $Z_2$ and $Z_3$ indicated by the symbols "×" and "Δ" respectively. Note that the horizontal axis shows the time t, while the vertical axis shows the variations.

The variation values $Z_2$ and $Z_3$ illustrated in this figure may have the period of beat components, for example, and are able to cancel the effects of IM unbalance in the event that such IM unbalance arises in the main amplifier 48.

Note that the phase modulation or amplitude modulation or both due to the variation data values $Z_2$ and $Z_3$ illustrated in FIG. 9 may be different from the data values for these variation data values $Z_2$ and $Z_3$ to compensate for the actual IM unbalance, so there may be cases in which the effects of distortion improvement are limited, but it is possible to achieve distortion compensation of IM unbalances at a higher precision than in the prior art, for example.

As described above, with the amplifier according to this embodiment, in a scheme in which amplitude correction and phase correction is performed with respect to the envelope of the input signal to perform distortion compensation on an amplifier, synchronization is eliminated between the input signal subject to correction by the amplitude/phase circuit 47 and the correction values from the D/A converter 46 in order to control this correction. In addition, the time of the delay circuit 42 is changed or the processing time of the route from the amplitude detector 43 to the D/A converter 46 is changed in order to reduce the IM distortion of the whole. Note that it is possible to perform either amplitude correction or phase correction or both.

Accordingly, with the amplifier according to this embodiment, it is possible to effectively perform distortion compensation on a main amplifier 48 in which IM unbalance has occurred over the range of fluctuation of the input signal, and it is possible to correct the unbalance between the higher frequency band and lower frequency band of third order distortion arising in the main amplifier 48.

Here, the constitution of the distortion compensator and other components according to the present invention is not necessarily limited to that presented above, but rather various constitutions may be used. Note that the present invention may also be provided as a method of executing the process according to the present invention, or as a computer program for implementing such a method.

In addition, the applicable fields of the present invention are not necessarily limited to those illustrated above, but rather the present invention may be applied to various fields. For example, the present invention is applicable not only to mobile communications systems but also to other communications systems, and it is also applicable to systems other than communications systems.

In addition, the various processing performed in the distortion compensator or the like according to the present invention may be constituted by being implemented in hardware resources equipped with a processor and memory and the like, for example, being controlled by means of a processor executing a control program stored in read-only memory (ROM). In addition, the various functional means for executing this processing may also be constituted as independent hardware circuits.

In addition, the present invention may also be understood as one wherein the above control program (itself) is stored in a floppy disc®, CD-ROM or other computer-readable recording media, so that the processing according to the present invention can be implemented by loading said control program from the recording medium into a computer and executing the program by a processor.

As described above, with the distortion compensator according to the present invention, at the time of compensating for distortion arising in an amplifier that amplifies a signal, the correspondence between the signal level and the mode of changing the signal for distortion compensation is stored in the case that the direction of change in the signal level is the positive direction, and also the correspondence between the signal level and the mode of changing the signal for distortion compensation is stored in the case that the direction of change in the signal level is the negative direction. The level of the signal subject to amplification by the amplifier is detected, and the direction of change in the level of the signal subject to amplification by the amplifier is detected to be either the positive direction or the negative direction. Based on the stored content of these two correspondences, the amplitude or phase or both of the signal subject to amplification by the amplifier is changed in a mode of changing the signal corresponding to the detected direction of change in the signal level and the detected signal level. Thus, when using an amplifier to amplify a signal consisting of two or more frequencies, for example, no unbalance occurs between the higher third order distortion and lower third order distortion, and distortion compensation can be performed accurately even if strict synchronization is not maintained between the timing of changing the signal subject to amplification by the amplifier and the timing of controlling this change process.

In addition, with the distortion compensator according to the present invention, with the constitution described above, the stored content of the correspondence between the signal level and the mode of changing the signal for distortion compensation is updated so as to decrease the distortion contained in the signal after amplification by the amplifier, so the accuracy of distortion compensation is kept high.

As described above, with the distortion compensator according to the present invention, at the time of compensating for distortion arising in an amplifier that amplifies a signal, the correspondence between the signal level and the mode of changing the signal for distortion compensation is stored. The level of the signal subject to amplification by the amplifier is detected. Based on the stored content of this correspondence, the amplitude or phase or both of the signal subject to amplification by the amplifier is changed in a mode of changing the signal corresponding to the detected signal level. In addition, the stored content of the correspondence between the signal level and the mode of changing the signal for distortion compensation is updated so as to decrease the distortion contained in the signal after amplification by the amplifier, and in this case, the timing of the signals subject to this change processing is made asynchronous form the timing of controlling this change processing based on the level of this signal. Thus, when using an amplifier to amplify a signal consisting of two or more frequencies, for example, no unbalance occurs between the higher third order distortion and lower third order distortion, the accuracy of distortion compensation can be improved.

What is claimed is:

1. A distortion compensator that compensates for distortion arising in an amplifier that amplifies a signal, wherein:
the distortion compensator comprises:
signal change means that changes the amplitude or phase or both of the signal subject to amplification by the amplifier,
signal level detection means that detects the level of the signal subject to amplification by the amplifier,
signal level change direction detection means that detects whether the direction of change in the level of the signal subject to amplification by the amplifier is the positive direction or the negative direction, and
signal change control means that stores the correspondence between the signal level and a mode of changing the signal for distortion compensation in the case that the direction of change in the signal level is the positive direction, and also stores the correspondence between the signal level and the mode of changing the signal for distortion compensation in the case that the direction of change in the signal level is the negative direction, and based on the content thus stored, controls the signal change means such that it changes the signal subject to amplification by the amplifier in the mode of changing the signal corresponding to the direction of change in the signal level detected by the signal level change direction detection means and the signal level detected by the signal level detection means.

2. The distortion compensator according to claim 1, further comprising:
a signal change control content updating means that updates the content of the correspondence between the signal level and mode of changing the signal for distortion compensation stored by the signal level change control means so that the distortion contained in the signal after being amplified by the amplifier is reduced.

3. The distortion compensator according to claim 1, wherein:
the amount of change in the amplitude of the signal or the amount of change in the phase of the signal or both are used as the mode of changing the signal for distortion compensation.

4. The distortion compensator according to claim 2, wherein:
the amount of change in the amplitude of the signal or the amount of change in the phase of the signal or both are used as the mode of changing the signal for distortion compensation.

5. The distortion compensator according to claim 1, wherein:
a signal consisting of a plurality of frequency components is used as the signal subject to amplification by the amplifier.

6. The distortion compensator according to claim 2, wherein:
a signal consisting of a plurality of frequency components is used as the signal subject to amplification by the amplifier.

7. The distortion compensator according to claim 1, wherein:
the distortion compensator comprises:
a first splitter, a delay circuit, an amplitude detector, an A/D converter, a table switching circuit, a positive slope table block, a negative slope table block, a first switch, a second switch, a D/A converter, an amplitude/phase circuit and a main amplifier, where:
the main amplifier is the amplifier subject to distortion compensation,
the signal change means is constituted by the functions of the amplitude/phase circuit,
the signal level detection means is constituted by the functions of the amplitude detector,
the signal level change direction detection means is constituted by the functions of the amplitude detector and the functions of the table switching circuit,
the signal change control means is constituted by the functions of the A/D converter, the functions of the positive slope table block, the functions of the negative slope table block, the functions of the table switching circuit, the functions of the first switch, the functions of the second switch and the functions of the D/A converter, and where:
the first splitter splits the input signal, outputs one branch of the split signal to the delay circuit and outputs the other branch of the split signal to the amplitude detector,
the amplitude detector detects the amplitude level of the other branch of the split signal input from the first splitter and outputs the results of this detection to the A/D converter and table switching circuit,
the A/D converter converts the results of detection input from the amplitude detector from an analog signal to a digital signal which is output to the first switch,
the first switch has the function of switching the input destination of the output from the A/D converter between the positive slope table block and the negative slope table block,
the positive slope table block stores in memory amplitude correction data for correcting the amplitude and phase correction data for correcting the phase corresponding to the case in which the output from the amplitude detector is a positive slope, as a positive slope table keyed on the amplitude level and in addition, a lookup of this table is performed to read out the amplitude correction data and phase correction data corresponding to the results of detection of the amplitude level input from the A/D converter via the first switch and output this data to the second switch,
the negative slope table block stores in memory amplitude correction data for correcting the amplitude and phase correction data for correcting the phase corresponding to the case in which the output from the amplitude detector is a negative slope, as a negative slope table keyed on the amplitude level and in addition, a lookup of this table is performed to read out the amplitude correction data and phase correction data corresponding to the results of detection of the amplitude level input from the A/D converter via the first switch and output this data to the second switch,
the second switch has the function of switching the origin of output to the D/A converter between the positive slope table block and the negative slope table block,
the table switching circuit detects the direction of the slope in the results of detection input from the amplitude detector and switches the first switch and second switch so as to connect the positive slope table block to the A/D converter and D/A converter in the case in which this slope is in the positive direction, but switches the first switch and second switch so as to connect the negative slope table block to the A/D converter and D/A converter in the case in which this slope is in the negative direction, the D/A converter converts the amplitude correction data and phase correction data input via the second switch from a digital signal to an analog signal which is output to the amplitude/phase circuit, the delay circuit delays one branch of the split signal input from the first splitter and outputs it to the amplitude/phase circuit, the amplitude/phase circuit applies to one branch of the split signal input from the delay circuit an amplitude distortion based on the amplitude correction data input from the D/A converter and also applies a phase distortion based on the phase correction data input from the D/A converter, and outputs to the main amplifier that one branch of the split signal with the amplitude distortion and the phase distortion applied, the main amplifier amplifies and outputs one branch of the split signal input from the amplitude/phase circuit.

8. The distortion compensator according to claim 7, wherein:

the distortion compensator further comprises a second splitter, a distortion detector and a table update circuit, where the signal change control content updating means, which updates the content of the correspondence between the signal level and mode of changing the signal for distortion compensation stored by the signal level change control means so that the distortion contained in the signal after being amplified by the amplifier is reduced, is constituted by the functions of the second splitter, the functions of the distortion detector and the functions of the table update circuit, the second splitter splits off a portion of the amplified signal output from the main amplifier and outputs this split signal to the distortion detector, the distortion detector detects any distortion components remaining after distortion compensation in the split signal input from the second splitter, and outputs the results of this detection to the table update circuit, and based on the results of detection input from the distortion detector, the table update circuit calculates amplitude correction data and phase correction data for both the positive slope table block and the negative slope table block so that the distortion components contained in the split signal acquired from the second splitter are minimized, and outputs the results of these calculations to the positive slope table block and the negative slope table block, respectively, thereby updating the amplitude correction data and phase correction data stored in the positive slope table block and the negative slope table block.

9. A predistortion type distortion-compensated amplifier having a distortion compensator that compensates for distortion arising in an amplifier that amplifies a signal, wherein:

the predistortion type distortion-compensated amplifier comprises:

signal change means that changes the amplitude or phase or both of the signal subject to amplification by the amplifier, signal level detection means that detects the level of the signal subject to amplification by the amplifier, signal level change direction detection means that detects whether the direction of change in the level of the signal subject to amplification by the amplifier is the positive direction or the negative direction, and signal change control means that stores the correspondence between the signal level and a mode of changing the signal for distortion compensation in the case that the direction of change in the signal level is the positive direction, and also stores the correspondence between the signal level and the mode of changing the signal for distortion compensation in the case that the direction of change in the signal level is the negative direction, and based on the content thus stored, controls the signal change means such that it changes the signal subject to amplification by the amplifier in the mode of changing the signal corresponding to the direction of change in the signal level detected by the signal level change direction detection means and the signal level detected by the signal level detection means.

10. The predistortion type distortion-compensated amplifier according to claim 9, further comprising:

a signal change control content updating means that updates the content of the correspondence between the signal level and mode of changing the signal for distortion compensation stored by the signal level change control means so that the distortion contained in the signal after being amplified by the amplifier is reduced.

11. A communication station unit of a mobile communications system having a distortion compensator that compensates for distortion arising in an amplifier that amplifies a signal to be sent, wherein:

the communication station unit of the mobile communications system comprises:

signal change means that changes the amplitude or phase or both of the signal subject to amplification by the amplifier, signal level detection means that detects the level of the signal subject to amplification by the amplifier, signal level change direction detection means that detects whether the direction of change in the level of the signal subject to amplification by the amplifier is the positive direction or the negative direction, and signal change control means that stores the correspondence between the signal level and a mode of changing the signal for distortion compensation in the case that the direction of change in the signal level is the positive direction, and also stores the correspondence between the signal level and the mode of changing the signal for distortion compensation in the case that the direction of change in the signal level is the negative direction, and based on the content thus stored, controls the signal change means such that it changes the signal subject to amplification by the amplifier in the mode of changing the signal corresponding to the direction of change in the signal level detected by the signal level change direction detection means and the signal level detected by the signal level detection means.

12. The communication station unit of the mobile communications system according to claim 11, further comprising:

a signal change control content updating means that updates the content of the correspondence between the signal level and mode of changing the signal for distortion compensation stored by the signal level change control means so that the distortion contained in the signal after being amplified by the amplifier is reduced.

13. A distortion compensator that compensates for distortion arising in an amplifier that amplifies a signal, wherein:

the distortion compensator comprises:

signal change means that changes the amplitude or phase or both of the signal subject to amplification by the amplifier, signal level detection means that detects the level of the signal subject to amplification by the amplifier, signal change control means that stores the correspondence between the signal level and a mode of changing the signal for distortion compensation, and based on the content thus stored, controls the signal change means such that it changes the signal subject to amplification by the amplifier in a mode of changing the signal corresponding to the signal level detected by the signal level detection means, and a signal change control content updating means that updates the content of the correspondence between the signal level and mode of changing the signal for distortion compensation stored by the signal level change control means so that the distortion contained in the signal after being amplified by the amplifier is reduced, and where the timing of signals processed by the signal change means is asynchronous from the timing of controlling the signal change means based on the level of this signal by the signal change control means.

14. The distortion compensator according to claim 13, wherein:

the amount of change in the amplitude of the signal or the amount of change in the phase of the signal or both are used as the mode of changing the signal for distortion compensation.

15. The distortion compensator according to claim 13, wherein:

a signal consisting of a plurality of frequency components is used as the signal subject to amplification by the amplifier.

16. The distortion compensator according to claim 13, wherein:

the distortion compensator comprises:

a first splitter, a delay circuit, an amplitude detector, an A/D converter, a table block, a D/A converter, an amplitude/phase circuit, a main amplifier, a second splitter, a distortion detector and a table updating circuit, where:

the main amplifier is the amplifier subject to distortion compensation, the signal change means is constituted by the functions of the amplitude/phase circuit, the signal level detection means is constituted by the functions of the amplitude detector, the signal change control means is constituted by the functions of the A/D converter, the functions of the table block and the functions of the D/A converter, the signal change control content updating means is constituted by the functions of the second splitter, the functions of the distortion detector and the functions of the table update circuit, and where:

the first splitter splits the input signal, outputs one branch of the split signal to the delay circuit and outputs the other branch of the split signal to the amplitude detector, the amplitude detector detects the amplitude level of the other branch of the split signal input from the first splitter and outputs the results of this detection to the A/D converter, the A/D converter converts the results of detection input from the amplitude detector from an analog signal to a digital signal which is output to the table block, the table block stores in memory amplitude correction data for correcting the amplitude and phase correction data for correcting the phase, as a table keyed on the amplitude level and in addition, a lookup of this table is performed to read out the amplitude correction data and phase correction data corresponding to the results of detection input from the A/D converter and output this data to the D/A converter, the D/A converter converts the amplitude correction data and phase correction data input from the table block from a digital signal to an analog signal which is output to the amplitude/phase circuit, the delay circuit delays one branch of the split signal input from the first splitter and outputs it to the amplitude/phase circuit, the amplitude/phase circuit applies to one branch of the split signal input from the delay circuit an amplitude distortion based on the amplitude correction data input from the D/A converter and also applies a phase distortion based on the phase correction data input from the D/A converter, and outputs to the main amplifier that one branch of the split signal with the amplitude distortion and the phase distortion applied, the main amplifier amplifies and outputs one branch of the split signal input from the amplitude/phase circuit, the second splitter splits off a portion of the amplified signal output from the main amplifier and outputs this split signal to the distortion detector, the distortion detector detects any distortion components remaining after distortion compensation in the split signal input from the second splitter, and outputs the results of this detection to the table update circuit, and based on the results of detection input from the distortion detector, the table update circuit calculates amplitude correction data and phase correction data so that the distortion components contained in the split signal acquired from the second splitter are minimized, and outputs the results of these calculations to the table block, thereby updating the amplitude correction data and phase correction data stored in the table block.

17. A predistortion type distortion-compensated amplifier having a distortion compensator that compensates for distortion arising in an amplifier that amplifies a signal, wherein:

the predistortion type distortion-compensated amplifier comprises:

signal change means that changes the amplitude or phase or both of the signal subject to amplification by the amplifier, signal level detection means that detects the level of the signal subject to amplification by the amplifier, signal change control means that stores the correspondence between the signal level and a mode of changing the signal for distortion compensation, and based on the content thus stored, controls the signal change means such that it changes the signal subject to amplification by the amplifier in the mode of changing the signal corresponding to the signal level detected by the signal level detection means, and a signal change control content updating means that updates the content of the correspondence between the signal level and mode of changing the signal for distortion compensation stored by the signal level change control means so that the distortion contained in the signal after being amplified by the amplifier is reduced, and where the timing of signals processed by the signal change means is asynchronous from the timing of controlling the signal change means based on the level of this signal by the signal change control means.

18. A communication station unit of a mobile communications system having a distortion compensator that compensates for distortion arising in an amplifier that amplifies a signal to be sent, wherein:

the communication station unit of the mobile communications system comprises:

signal change means that changes the amplitude or phase or both of the signal subject to amplification by the amplifier, signal level detection means that detects the level of the signal subject to amplification by the amplifier, signal change control means that stores the correspondence between the signal level and a mode of changing the signal for distortion compensation, and based on the content thus stored, controls the signal change means such that it changes the signal subject to amplification by the amplifier in the mode of changing the signal corresponding to the signal level detected by the signal level detection means, and a signal change control content updating means that updates the content of the correspondence between the signal level and mode of changing the signal for distortion compensation stored by the signal level change control means so that the distortion contained in the signal after being amplified by the amplifier is reduced, and where the timing of signals processed by the signal change means is asynchronous from the timing of controlling the signal change means based on the level of this signal by the signal change control means.

* * * * *